United States Patent [19]
Yuan

[11] Patent Number: 5,652,689
[45] Date of Patent: Jul. 29, 1997

[54] ESD PROTECTION CIRCUIT LOCATED UNDER PROTECTED BONDING PAD

[75] Inventor: Lee Chung Yuan, Chung-Li, Taiwan

[73] Assignee: United Microelectronics Corporation, Hsin-Chu, Taiwan

[21] Appl. No.: 294,849

[22] Filed: Aug. 29, 1994

[51] Int. Cl.$^6$ ............................................. H02H 9/00
[52] U.S. Cl. ........................... 361/56; 361/91; 361/111; 361/118
[58] Field of Search .................... 361/56, 91, 111, 361/118

[56] References Cited

U.S. PATENT DOCUMENTS

| | | | |
|---|---|---|---|
| 4,733,285 | 3/1988 | Ishioka et al. | 357/23.13 |
| 4,803,541 | 2/1989 | Kouda | 357/68 |
| 4,806,999 | 2/1989 | Strauss | 357/23.13 |
| 5,182,220 | 1/1993 | Ker et al. | 437/34 |

Primary Examiner—Jeffrey A. Gaffin
Assistant Examiner—Stephen Jackson
Attorney, Agent, or Firm—William H. Wright

[57] ABSTRACT

A circuit for protecting a bonding pad of a semiconductor device from ESD voltages is located under the pad to permit the space otherwise used for a protection circuit to be used for normal operating components. The protection circuit has a compact layout that provides maximum ability to handle an ESD current within this limited space. The semiconductor structure for the circuit has separate parts for two SCR circuits, one for each polarity of ESD current. Each SCR circuit comprises two symmetrical SCR structures.

14 Claims, 4 Drawing Sheets

1

ESD PROTECTION CIRCUIT LOCATED UNDER PROTECTED BONDING PAD

FIELD OF THE INVENTION

This invention relates generally to semiconductor devices and more specifically to a circuit for protecting the device from the voltage of an electrostatic discharge (ESD).

INTRODUCTION

ESD is a familiar problem in the design of semiconductor devices. When an ESD voltage appears at an input-output terminal of a device, it can destroy circuits that are connected to the terminal. These terminals are enlargements of conductive stripes on the surface of the device and are commonly called pads. Field effect transistor are particularly liable to be damaged because the gate oxide is thin and is easily damaged by small voltages that would not damage other components. These circuits are commonly protected by a circuit that is connected to the pad and is turned on by a voltage that is associated with an electrostatic discharge.

A problem with these circuits is that they do not contribute to the ordinary operation of the device and they require silicon area that could otherwise be used for circuits that perform other functions. This lost space is significant because these semiconductor devices have many input/output pads and they commonly have a protection circuit for each pad. It is a common goal in this art to reduce the space required by these protection circuits.

THE PRIOR ART

U.S. Pat. No. 5,182,220 to M. D. Ker, assigned to the assignee of this invention, shows a protection circuit with silicon controlled rectifiers (SCRs) connected to conduct between the input line and ground and between the input line and $V_{DD}$.

SUMMARY OF THE INVENTION

One object of this invention is to avoid using much or all of the space that is otherwise required for ESD protection but could be used for operating circuits.

The protection circuit of this invention is adapted to be located under the pad it protects. This space is normally unused, and the space that would otherwise be used for protection circuits can be used for other purposes.

Another object is to provide a new ESD protection circuit that has a low capacitance and is faster than conventional protection circuits. Locating the circuit under the pad shortens some of the conductors and thereby decreases their inductance and resistance and also reduces the parasitic capacitance of the protection circuit.

The specific embodiment of the invention has features and advantages that will be apparent in the description of the preferred embodiment or will be specifically explained.

THE DRAWING

THE PREFERRED EMBODIMENT

Figure 1:
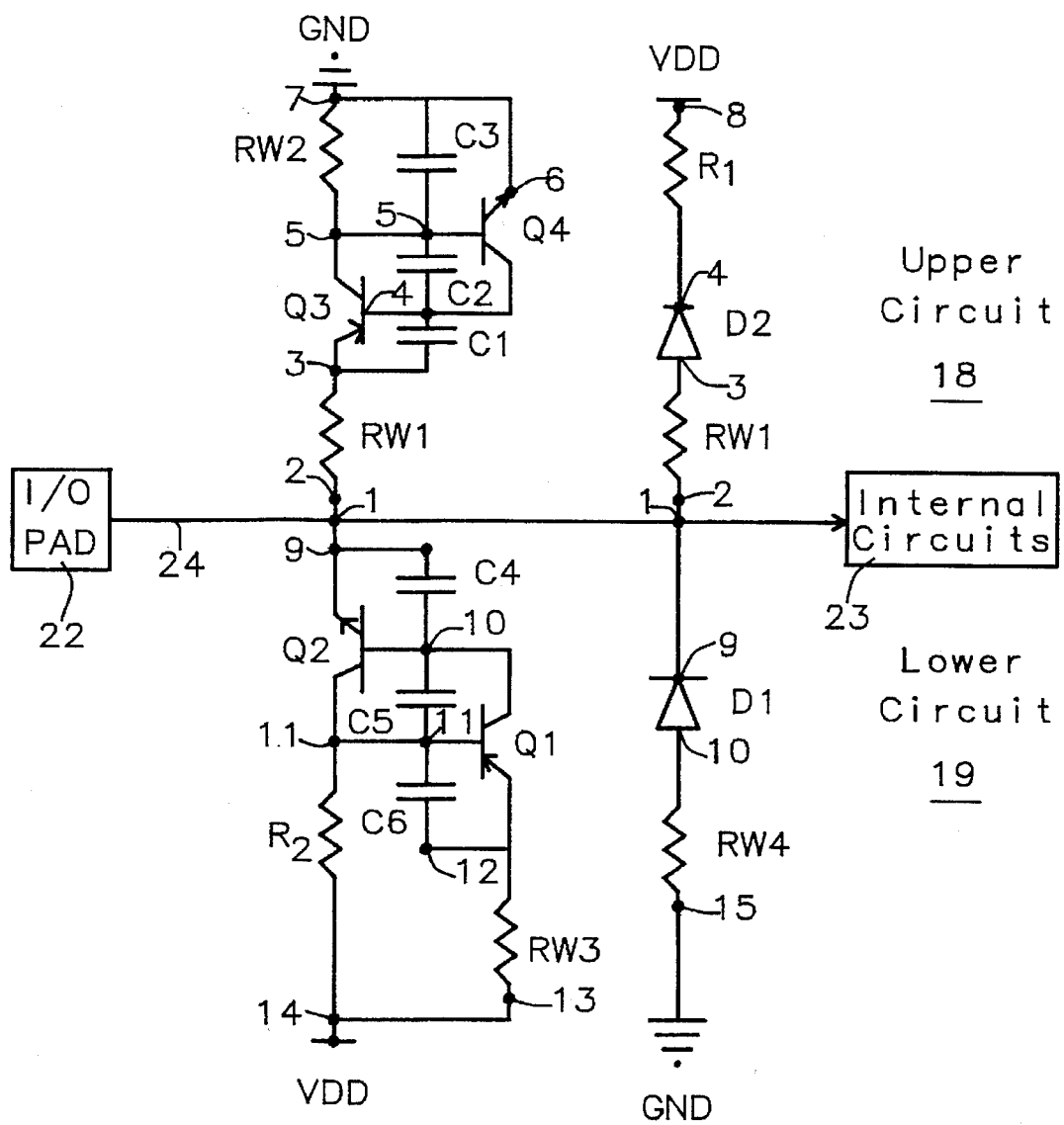
FIG. 1 is a schematic of the protection circuit formed by the preferred semiconductor device of this invention and shows the upper SCR and lower SCR and associated components.

FIG. 1—Introduction

FIG. 1 shows an I/O pad 22, the internal circuits 23 that are to be protected, a conductive line 24 that connects the pad to the internal circuits and the upper SCR circuit 18 and the lower SCR circuit 19 that protect the internal circuits from ESD voltages at the pad. The two SCR circuits are similar to the corresponding transistors of Ker, but the associated components differ because the semiconductor structures differ. Some of the reference characters identify nodes in FIG. 1 that correspond to semiconductor structures in FIGS. 2–4.

FIG. 1—The Upper SCR Circuit

PNP transistor Q3 and NPN transistor Q4 are interconnected to form an SCR. When either Q3 or Q4 conducts in its emitter-collector circuit, it provides base current to turn on the other transistor. When both transistors have been turned on, they stay latched on until their base current has been interrupted or has been reduced to a value that will not sustain the latching operation.

These transistors and the associated components conduct between ground and line 24 when a positive ESD voltage appears at pad 22. The circuits conduct with a sufficiently low resistance to prevent the voltage on line 24 from damaging the internal circuits.

The transistors can be turned on in several ways. If the voltage on line 24 becomes sufficiently positive, the reverse biased base-collector junctions can break down, for example by impact ionization, and provide base current for the other transistor.

The transistors can also turn on in response to a fast rising positive going voltage on line 24. Note the capacitors C1, C2 and C3. If the voltage at the I/O pad rises fast enough, a charging current will flow to ground in the circuit path of resistor RW1, the base-emitter junction of Q3, and the series circuit of capacitors C2 and C3. Similarly, a circuit to ground is formed by RW1, C1, C2 and the base-emitter junction of Q4 Thereafter, Q3 conducts in circuit with the base-emitter junction of Q4, and Q4 conducts in circuit with the base-emitter junction of Q3 to establish the latching operation.

A diode D2 is formed between the line 24 and VDD in series circuit with resistors R1 and RW1. This diode is forward biased by normal positive voltages on line 24 but it operates in the high resistance part of its volt-ampere characteristic because these voltages appear mostly across the two series resistors R1 and RW1. Diode D2 conducts in its reverse direction in response to a higher negative voltage on line 24.

Figure 2:
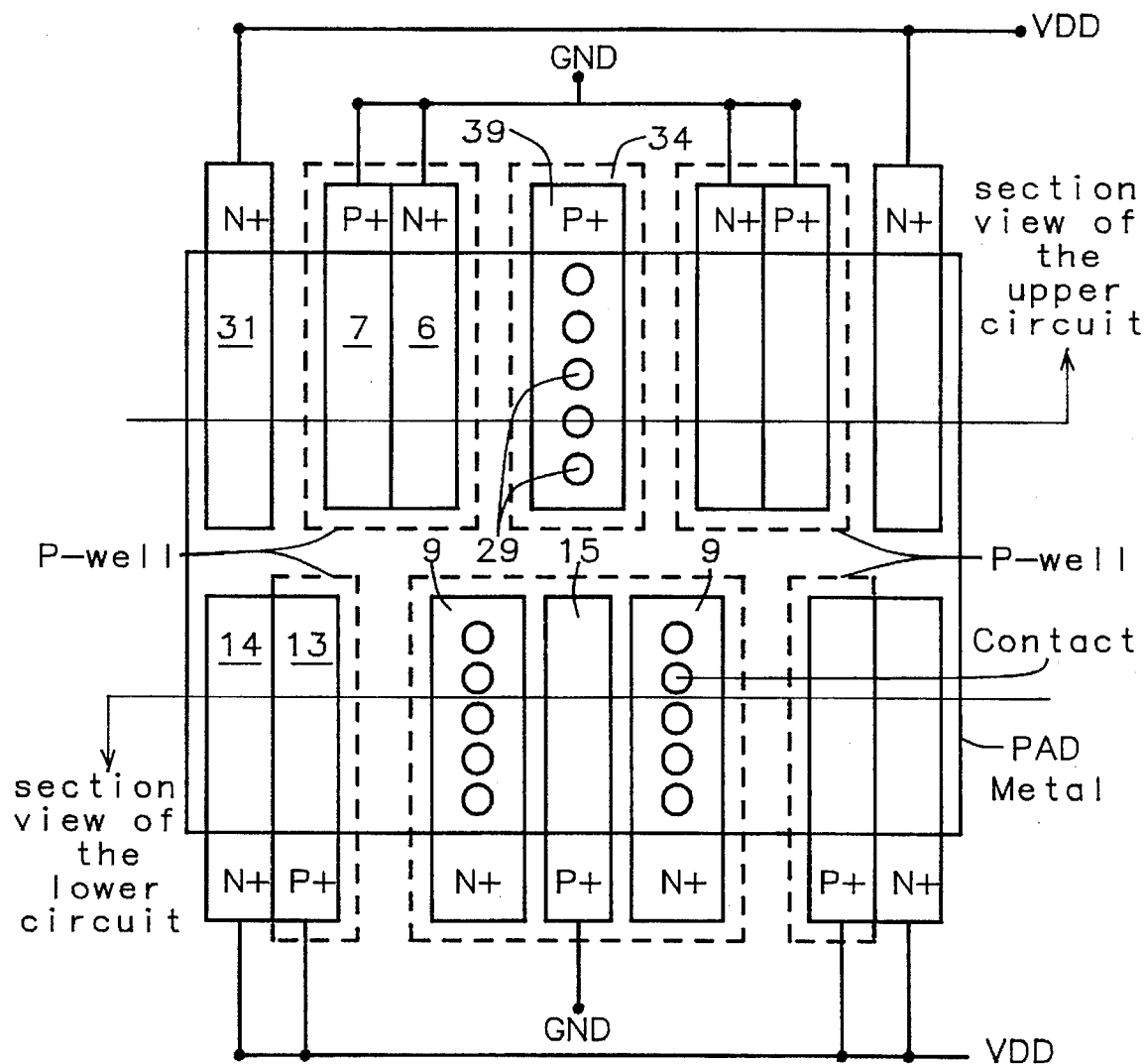
FIG. 2 is a plan view of the preferred semiconductor device, showing both the upper SCR and the lower SCR.
Figure 3:
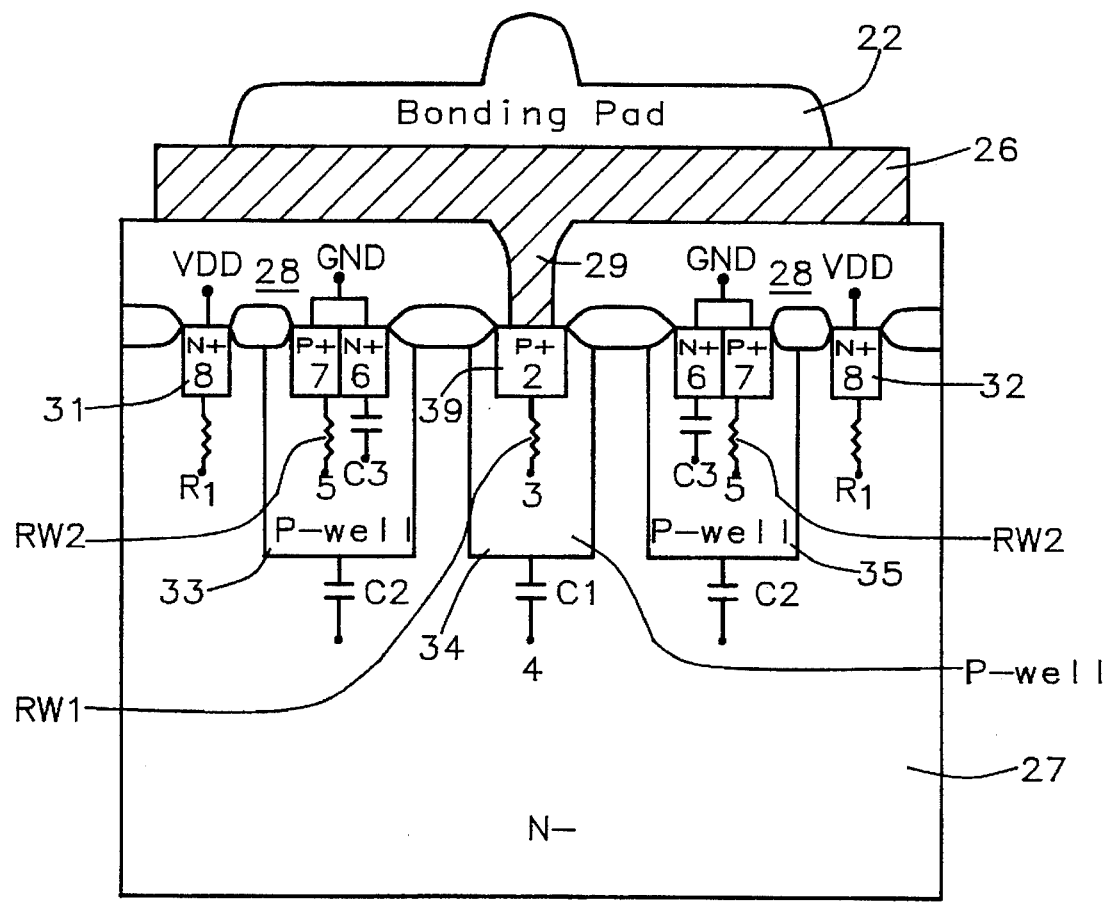
FIG. 3 is an edge view of the part of the preferred semiconductor device that forms the upper SCR.
Figure 4:
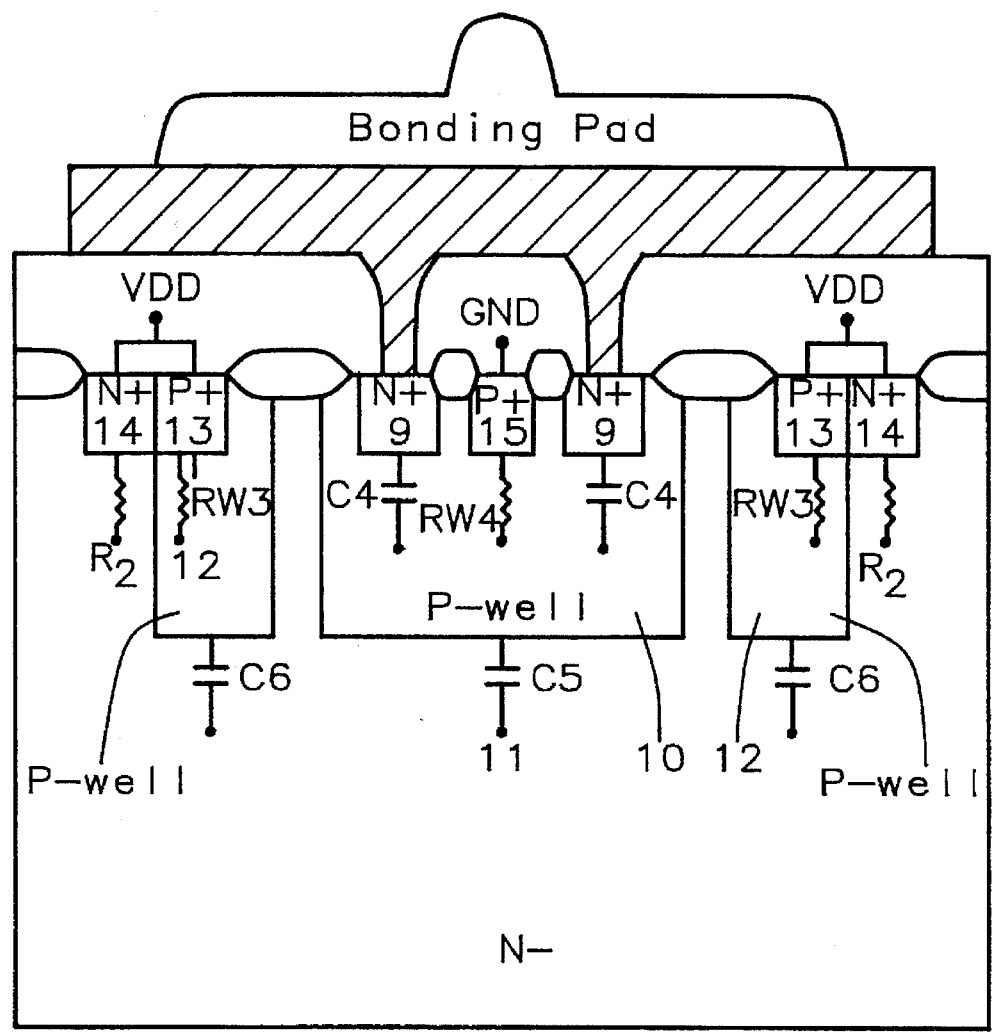
FIG. 4 is an edge view of the part of the preferred semiconductor device that forms the lower SCR.

Resistor RW1 is shown twice in Fig. (at the anode of D2 and the emitter of Q3) to simplify the circuit diagram and simplify its relation to FIGS. 2–4.

The Lower SCR Circuit

In the lower circuit 19, transistors Q2 and Q1 are connected to form an SCR that conducts between line 24 and VDD. The lower SCR turns on in response to a predetermined high voltage of a negative polarity on line 24 and from a fast rising negative going pulse on line 24, as will be understood from the description of the analogous operation of the upper SCR. The structure that forms this SCR also forms a diode D1 which conducts in its reverse direction in the way described for diode D2. These devices and their associated components will be understood from the detailed description of the upper SCR circuit and from the description of the semiconductor structure that forms the lower circuit.

The SCR Structure—Introduction to FIGS. 2–4

The device has an N⁻ substrate 27, circuit devices (to be described later) formed in the upper surface, a layer 28 of an insulating material such as glass, a metal layer 26 and a bonding pad 22. The substrate 27 and its overlying insulation extend beyond the sides shown in the edge views of FIGS. 3 and 4 to include the internal circuits 23 of FIG. 1 and ordinarily to include other circuits and other pads (preferably with individual protection circuits of this invention). The pad metal layer 26 extends to form conductor 24 which connects the pad 22 to the internal circuits 23. The bonding pad has approximately the size shown in relation to the structure that forms the protection device. These structures are well known and the invention will be useful with other semiconductor arrangements.

The Upper SCR Structure—FIGS. 2 and 3

This protection device is formed in three p-wells; two n+ regions provide for connection to the $V_{DD}$ terminal of a power supply. These five regions are insulated at the surface of the substrate by suitable insulation such as the field oxide represented by the elongated hexagonal shapes. The structure is symmetrical about a vertical centerline in the drawing and two upper circuits as shown in FIG. 1 are formed, one on each side of this dividing line.

An opening is provided in the general insulation layer 28 to permit a single downward extension 29 of the pad metal 26 to contact the center well. A p+ region in the well forms node 2 and makes this connection.

N+ diffusions 31 and 32 form node 8, a connection between the substrate and VDD. The path from these diffusions to the other components forms resistor $R_1$.

The center p-well 34 cooperates with each outside p-well 33 and 35 and the intervening substrate to form a transistor Q3 as a lateral parasitic bipolar structure. The center p-well forms node 3, the emitter of PNP transistor Q3 and p-wells 33 and 35 each form the collector of this transistor and the intervening substrate forms node 4, the base. The path through the center well forms resistor RW1.

Transistor Q4 is formed as a vertical parasitic bipolar transistor in each outer well 33 and 35. N+ diffusion in the outer wells form node 6, the emitter of NPN transistor Q4. The underlying substrate forms node 4 the collector of Q4, and the intervening part of the outer p-well forms the base.

The junction of the center well 34 and the substrate form the diode D2.

The capacitance formed by the junction of the center p-well and the substrate is represented by a schematic capacitor C1. All paths through C1 include RW1. These capacitor electrodes are node 3 and node 4 respectively.

Capacitor C1 forms a circuit between node 3 (one end of resistor RW1, just described) and node 4 in the upper SCR circuit, the common connection point of the base of the PNP transistor and the collector of the NPN.

The Lower Circuit—FIGS. 2 and 4

The lower circuit is formed in three p-wells. The center p-well 10 has a P+ diffusion 15 for connection to ground. This connection is shown schematically in the drawing and is shown in detail in FIG. 2.

N+ diffusions symmetrically arranged in the center p-well with respect to ground diffusion 15 are connected to the pad metal by extensions that are similar to conductor 29 in FIG. 3. An N+ diffusion adjacent to the outside wells forms a connection from VDD to the substrate 4.

The center well 10, the outside wells 12, and the intervening substrate cooperate to form transistor Q1 as a lateral parasitic bipolar PNP transistor. Well 12 forms the emitter, well 10 forms the collector, and the substrate forms the base. A P+ diffusion connects the outer well 12 to VDD and the path from this diffusion to the emitter region forms resistor RW3.

Q2 is a vertical parasitic transistor formed in the center well and the underlying substrate. An N+ diffusion in the center well which forms node 9, the emitter of Q2. The substrate 4 forms the collector and the intervening region of the center well 10 forms the base. The capacitors and resistors will be understood from the drawing and the more detailed description of FIG. 2.

OTHER EMBODIMENTS

From the description of the preferred embodiment of the invention, those skilled in the art will recognize variations within the spirit of the invention and the intended scope of the claims.

I claim:

1. In a semiconductor device of the type having a substrate, a bonding pad for making an external connection to the semiconductor device, a pad metal structure underlying the pad and extending on the surface of the semiconductor device to circuits that may be damaged by an ESD voltage at the pad, other bonding pads for connection to a ground power supply terminal and to another power supply terminal, the semiconductor device further including:

a protective device located under the pad metal structure and conductively connected to the pad metal for conducting ESD currents at the pad to at least one of the power supply terminals.

2. The semiconductor device of claim 1 wherein the protective device comprises means connected to the ground power supply terminal and the other power supply terminal for conducting ESD currents of either polarity to one of the power supply terminals.

3. The semiconductor device of claim 2 wherein the protective device comprises a first SCR circuit (18) connected to conduct between the pad metal and the ground power supply terminal and a second SCR circuit (19) connected to conduct between the pad metal and the other power supply terminal.

4. The semiconductor device of claim 3 wherein the first and second SCR circuits are connected to turn on in response to an ESD voltage opposite to a polarity of the ground and the other power supply terminals, respectively.

5. The semiconductor device of claim 4 wherein the first and second SCR circuits are formed in separate regions under the metal pad structure.

6. The semiconductor device of claim 5 wherein the first and second SCR circuits are each formed as two SCRs symmetrically arranged in it corresponding one of the separate regions under the metal pad structure.

7. The semiconductor device of claim 6, wherein the second SCR circuit is formed in part by a well located in the substrate, a diffusion of one conductivity type formed in the well on the line of symmetry of the two SCRs forming the second SCR circuit, and two diffusions of an opposite conductivity type formed in the well and located symmetrically away from the line of symmetry.

8. The semiconductor device of claim 6 including means connecting the pad metal structure to each of the two diffusions of the opposite conductivity type of the second SCR circuit.

9. The semiconductor device of claim 6 wherein the first SCR circuit is formed with one connection to the metal pad structure and the two SCRs are arranged symmetrically on either side of the connection.

10. The semiconductor device of claim 9 wherein the first SCR circuit is formed in part by a well located in the substrate under the connection and shared by the two SCRs of the first SCR circuit.

11. The semiconductor device of claim 1, wherein the protective device comprises:

- a first SCR circuit comprising first and second wells formed in the substrate and spaced apart and underlying part of the bonding pad;
- vertical interconnect means connecting the pad metal to the first well; and
- an N+ diffusion formed in the second well and forming an emitter of a vertical NPN bipolar transistor constituting part of the first SCR, the first well forming an emitter of a lateral PNP bipolar transistor, an intervening portion of the substrate forming a base of the PNP transistor and the substrate underlying the second well forming a collector of the NPN transistor, and the second well forming a base of the NPN transistor and a collector of the PNP transistor,
- whereby the PNP and NPN transistors form the first SCR circuit with a path through the second well forming a collector resistor within the PNP transistor and a path through the first well forming an emitter resistor within the PNP transistor.

12. The semiconductor device of claim 11, further comprising a contact between the N+ diffusion and a supply voltage, the contact formed beneath and insulated from the pad metal.

13. The semiconductor device of claim 11, wherein the vertical interconnect means comprises plural metal interconnects between the pad metal and the first well.

14. The semiconductor device of claim 12, wherein the power supply voltage is ground.

* * * * *